United States Patent [19]

Onozawa et al.

[11] Patent Number: 4,707,640
[45] Date of Patent: Nov. 17, 1987

[54] HORIZONTAL DEFLECTION OUTPUT CIRCUIT

[75] Inventors: Makoto Onozawa, Yokohama; Michitaka Osawa, Fujisawa; Hitoshi Maekawa; Koji Kito, both of Yokohama, all of Japan

[73] Assignee: Hitachi, Ltd., Tokyo, Japan

[21] Appl. No.: 795,780

[22] Filed: Nov. 7, 1985

[30] Foreign Application Priority Data

Nov. 9, 1984 [JP] Japan ................. 59-234951

[51] Int. Cl.⁴ ............................................. H01J 29/70
[52] U.S. Cl. .................................... 315/408; 315/370; 315/399
[58] Field of Search ............... 315/399, 371, 370, 400, 315/408

[56] References Cited

U.S. PATENT DOCUMENTS

| 3,732,458 | 5/1973 | Wolber | 315/370 |
| 4,144,479 | 3/1979 | Farina et al. | 315/399 |
| 4,254,365 | 3/1981 | Knight | 315/371 |
| 4,612,481 | 9/1986 | Storberg | 315/408 |

FOREIGN PATENT DOCUMENTS

| 54-44430 | 4/1979 | Japan | 315/399 |
| 54-17224 | 10/1979 | Japan | 315/370 |
| 1438679 | 6/1976 | United Kingdom | 315/408 |

Primary Examiner—Theodore M. Blum
Assistant Examiner—David Cain
Attorney, Agent, or Firm—Antonelli, Terry & Wands

[57] ABSTRACT

A horizontal deflection output circuit, such as used in a TV receiver or a display device, includes a series circuit composed of a ringing preventing resistor and a one-way switching element connected in parallel with a linearity correcting coil. That one-way switching element is turned on at the beginning of a horizontal scanning period to feed a current to the ringing preventing resistor but is turned off in the vicinity of a fly-back period to block the flow of the current to the ringing preventing resistor. Thus, the power loss due to the current flowing through the ringing preventing resistor for the fly-back period can be reduced according to the present invention.

32 Claims, 8 Drawing Figures

HORIZONTAL DEFLECTION OUTPUT CIRCUIT

BACKGROUND OF THE INVENTION

The present invention relates to a horizontal deflection output circuit which is to be used with a high resolution display and which has a high horizontal deflection frequency and a high output.

In a conventional TV receiver, a horizontal deflection current having a saw-tooth waveform reaches saturation as it approaches its maximum, causing a problem in that the scanning rate of the electron beam is reduced at the extreme right-hand side, as viewed toward the frame of the display, so that the picture reproduced on the face plate is distorted.

The circuit for solving the above-specified problem to form a symmetrical picture is called a "linearity correcting circuit". In order to correct the linearity of the raster scanned on the face plate, the linearity correcting circuit of the prior art is equipped with a linearity correcting coil which is connected in series with a horizontal deflection coil. That linearity correcting coil is so magnetically biased by means of a permanent magnet that its magnetic saturation characteristics are set differently depending upon the direction of the horizontal deflection current. This horizontal deflection circuit is exemplified by Japanese Patent Laid-Open Nos. 40615/1982, 128949/1981, 124850/1980 and U.S. Pat. No. 3,962,603, as shown schematically in FIGS. 1A and 1B.

As shown in FIG. 1A, the horizontal deflection circuit is composed of an input terminal 1, an output transistor 2, a damper diode 3, a resonant capacitor 4, a horizontal deflection coil 5, a linearity correcting coil 6, an S-shaped correction capacitor 7, a choke coil 8, a supply terminal 9, and a permanent magnet 12 for setting the magnetic bias of the linearity correcting coil 6.

The permanent magnet 12 has its polarity arranged so as to apply a magnetic field in the same direction as that of the magnetic field established in the linearity correcting coil in case a horizontal deflection current $I_{DY}$ flows in the direction of arrow a to the horizontal deflection coil 5.

In case the horizontal deflection current $I_{DY}$ flows in the direction of the arrow a, therefore, the linearity correcting coil 6 is more liable to be magnetically saturated than when the horizontal deflection current $I_{DY}$ flows in the reverse direction.

As a result, the inductance of the linearity correcting coil 6 is least in the vicinity of the maximum of the horizontal deflection current so that this current increases.

Thus, the drop of the scanning rate of the electron beam at the right side of the display frame is corrected. In the display, however, the use of a linearity correcting coil will form longitudinal shading streaks at the left side of the display frame. Those streaks are formed as a result of the fact that a ringing current is established in the horizontal deflection current by the resonance of a resonant circuit which is composed of the inductance of the linearity coil 6 and a stray capacity 17, as shown in FIG. 1B.

In order to solve this problem, the horizontal deflection circuit of the prior art is equipped with a resistor 14 which is connected in parallel with the linearity correcting coil 6. By the provision of that resistor 14, the resonant circuit of the stray capacity and the linearity correcting coil has its Q (i.e., quality) factor dropped to reduce the amplitude of the ringing current.

As the horizontal deflection current has its frequency increased and its output raised in accordance with the fineness in the structure of the display, however, there arises another problem that the power loss at the ringing current preventing resistor is increased.

SUMMARY OF THE INVENTION

An object of the present invention is to provide a horizontal deflection output circuit of high speed and output enabled to reduce such ringing of the horizontal deflection current as will raise a problem, when the horizontal linearity is to be corrected by a linearity correcting coil, without inviting an increase in the loss of the output circuit thereby to eliminate in a more advantageous way the longitudinal streaks which might otherwise be formed in a picture frame.

In order to achieve the above-specified object, the horizontal deflection output circuit according to the present invention has a series circuit connected in parallel with a linearity coil, the series circuit being composed of a resistor and a switching element. The switching element is so controlled that it may be turned on only for a predetermined time period including that for which ringing occurs in the horizontal deflection current.

DESCRIPTION OF THE PREFERRED EMBODIMENTS

Figure 2A:
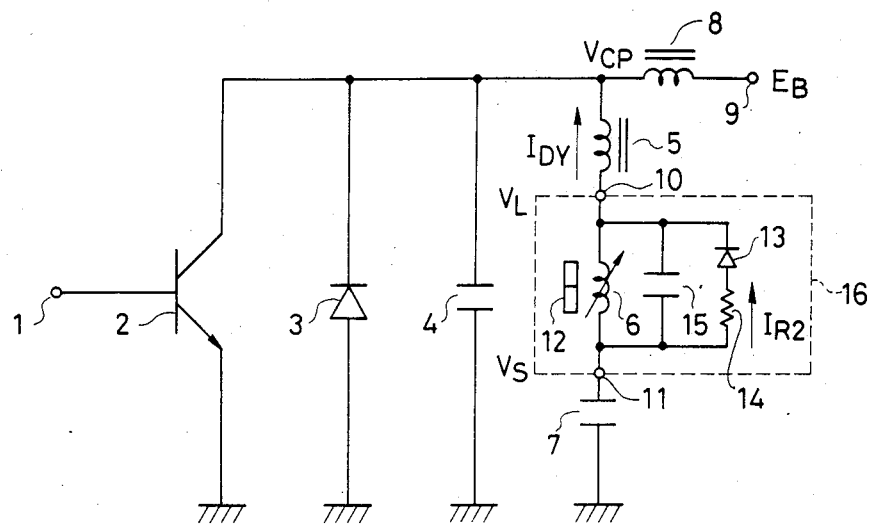
FIGS. 2A and 2B are circuit diagrams showing an embodiment of the horizontal deflection output circuit according to the present invention.

FIG. 2A shows a specific circuit of the present invention. In this circuit, the switching element is provided as a diode. The horizontal deflection output circuit of the present invention is composed of an input terminal 1, an output transistor 2, a damper diode 3, a resonant capacitor 4, a horizontal deflection coil 5, a linearity correcting coil 6, an S-shaped correction capacitor 7, a choke coil 8, a supply terminal 9, a permanent magnet 12, a diode 13, a resistor 14 and a capacitor 15.

Figure 2B:
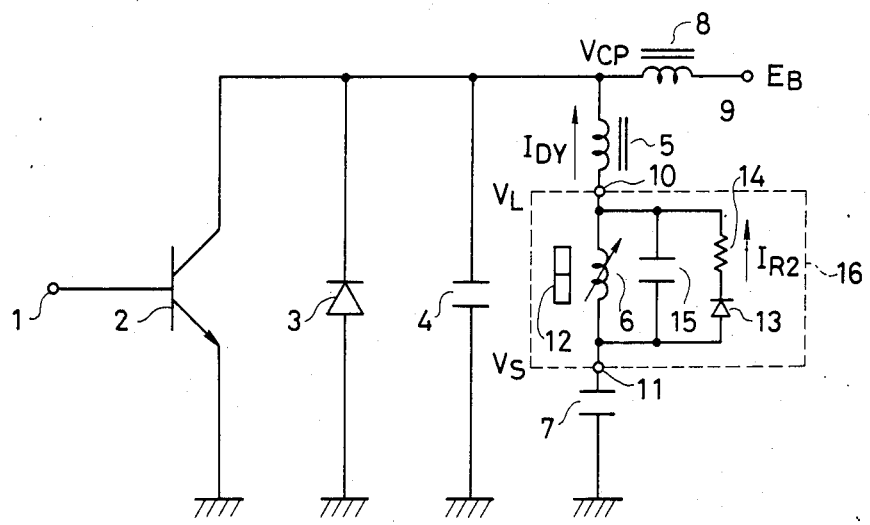

FIG. 2B has a construction similar to that of FIG. 2A except that the diode 13 and the resistor 14 of a linearity correcting circuit 16 are arranged reversely. The diode 13 is connected, as shown, in such a direction as is turned on during the prior half of the horizontal deflection period.

Figure 6:
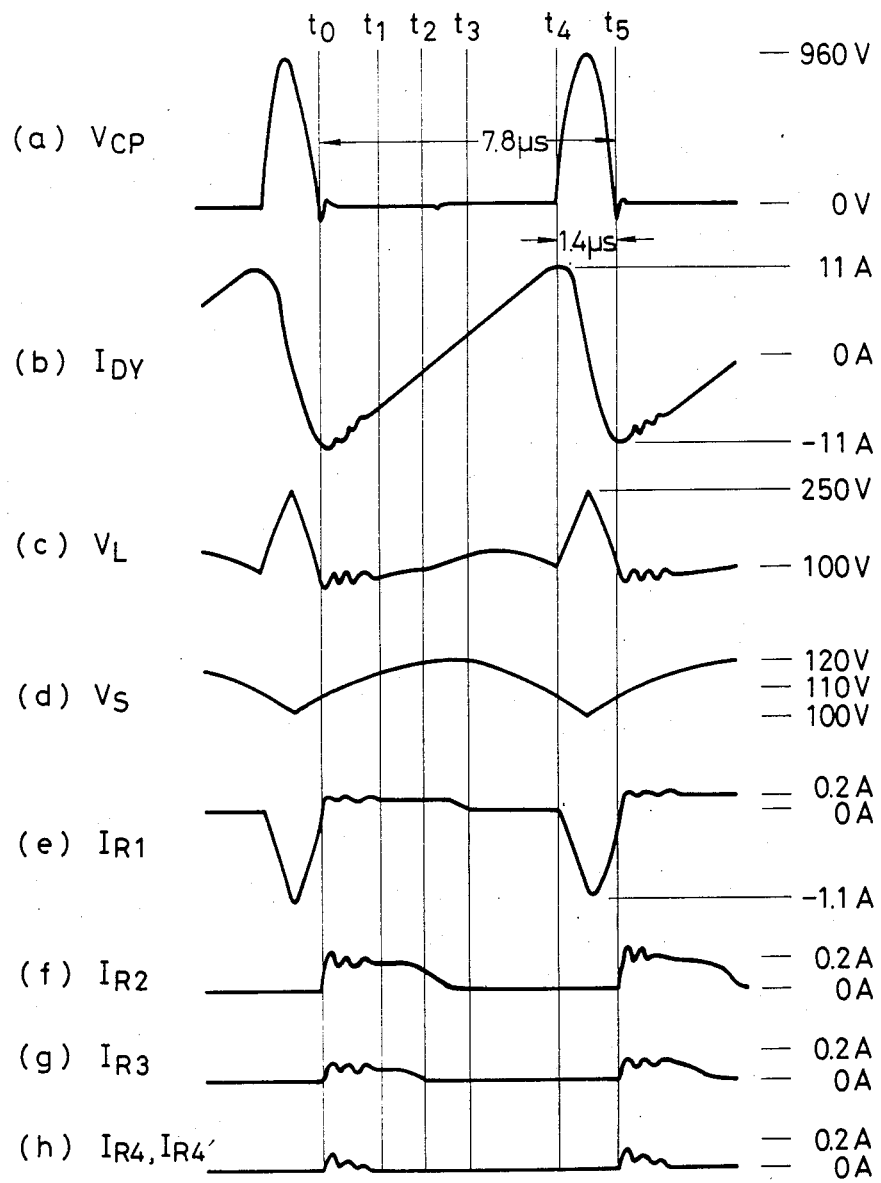
FIG. 6 is a waveform chart showing the signal waveforms of the individual portions of the horizontal deflection output circuit of the present invention.

FIG. 6 plots the voltage and current in case the circuit of the present embodiment is operated under the conditions of a horizontal deflection frequency of 130 KHz and a horizontal deflection current of 22 $[A_{p-p}]$. FIG. 6(a) plots the voltage waveform $V_{CP}$ at the node between the choke coil 8 and the horizontal deflection coil 5. FIG. 6(b) plots the waveform $I_{DY}$ of the horizontal deflection current flowing through the horizontal deflection coil 5. FIG. 6(c) plots the voltage waveform $V_L$ at the node 10 between the linearity correcting coil 6 and the horizontal deflection coil 5. FIG. 6(d) plots the voltage waveform $V_S$ at the node 11 between the linearity correcting coil 6 and the S-shaped correction capacitor 7. FIG. 6(e) plots the waveform $I_{R1}$ of the current flowing through the resistor 14 of FIG. 1B. FIG. 6(f) plots the waveform of the current $I_{R2}$ flowing through the resistor 14 of FIG. 2A.

In response to the ON and OFF of the output transistor 2, the voltage $V_{CP}$ is generated, as shown in FIG. 6(a), at the node b between the horizontal deflection coil 5 and the choke coil 8.

A period $t_4$ to $t_5$ is the fly-back time. At a time $t_0$ when the damper diode 3 is turned on, the horizontal deflection current $I_{DY}$ begins to flow through the horizontal deflection coil 5 and gradually rises until the time $t_4$. The disturbances in the waveforms of the horizontal deflection current $I_{DY}$ for the period $t_0$ to $t_1$, as shown in FIG. 6(b), are the result of the influences of the ringing current. The amplitude of the ringing current is suppressed to a small value by the action of the resistor 14. The diode 13 is rendered conductive for the rising period $t_0$ to $t_1$ of the horizontal deflection current $I_{DY}$. Then, the ringing current generated at the linearity coil 6 is consumed by the resistor 14 so that it becomes reluctant to flow into the horizontal deflection coil 5. This reduces the flow of the ringing current to be superposed on the horizontal deflection current $I_{DY}$.

Voltages $V_L$ and $V_S$ are generated, as shown in FIGS. 6(c) and 6(d), at the two terminals of the linearity correcting coil 6.

Figure 1A:
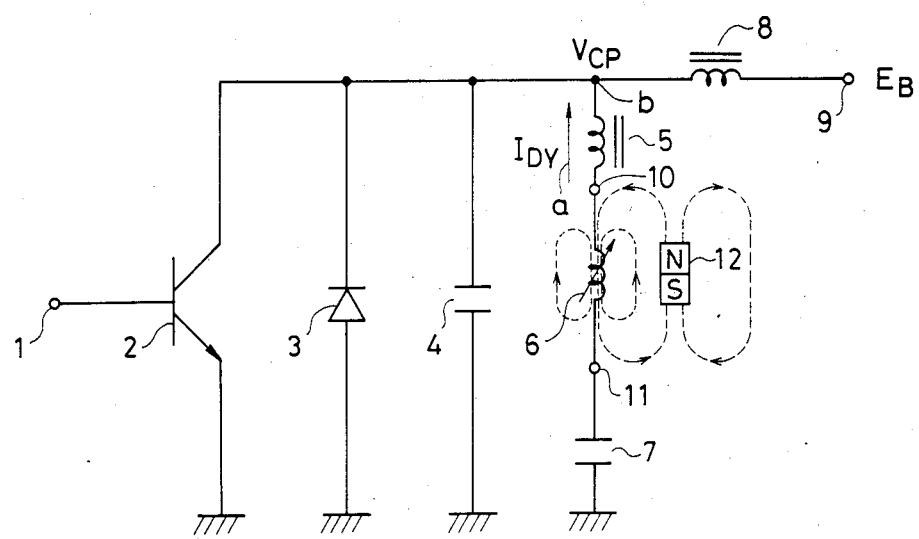
FIGS. 1A and 1B are circuit diagrams showing the horizontal deflection output circuits of the prior art.
Figure 1B:
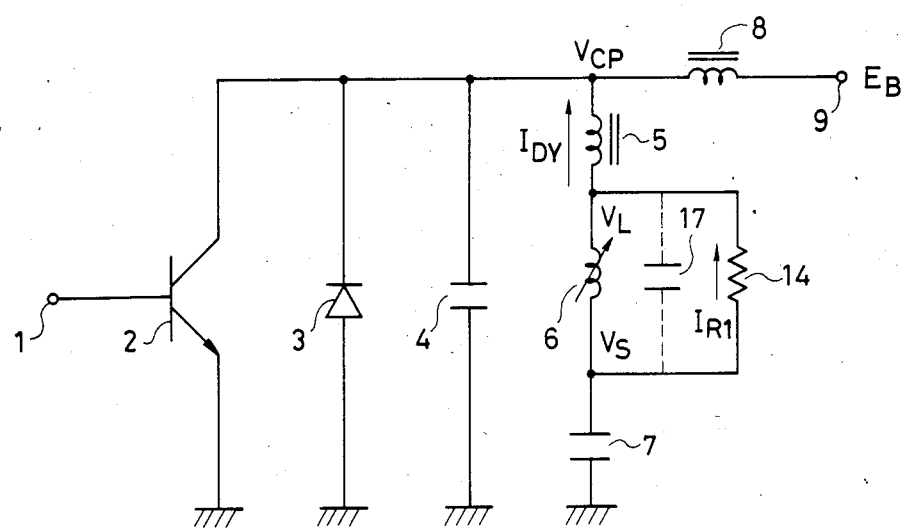

In the circuit of the prior art shown in FIG. 1(B), a current $I_{R1}$ flows, as shown in FIG. 6(e), through the resistor 14 in accordance with the potential difference $(V_L - V_S)$. According to the present invention, however, the diode 13 does not conduct during the fly-back period $t_4$ to $t_5$ of the horizontal deflection current although it is conducting for the period $t_0$ to $t_3$ including the rising period $t_0$ to $t_1$ of the horizontal deflection current. This makes it possible to prevent the power consumption at the resistor 14 for the fly-back period $t_4$ to $t_5$.

The power loss at the resistor 14 when the horizontal deflection output circuit of the present invention shown in FIG. 2 is operated at a horizontal deflection frequency of 130 KHz and a horizontal deflection current of 22 $[A_{p-p}]$ is 1.3 Watts according to the "waveform analysis" (i.e., the method of determining the power loss by multiplying the current waveform and the voltage waveform). This power loss is about one sixth as high as that in case the current $I_{R1}$ shown in FIG. 6(e) which flows through the resistor 14 of the circuit shown in FIG. 1B of the prior art.

Incidentally, the capacitor 15 of FIGS. 2A and 2B is connected in parallel with the stray capacity at the two terminals of the linearity correcting coil 6. If the capacitor 15 has its capacity varied, the frequency of the ringing current will be changed. By selecting the capacity of the capacitor 15 to be 470 pF, therefore, there can be attained an effect that the longitudinal streaks in the picture frame are almost erased.

Figure 3:
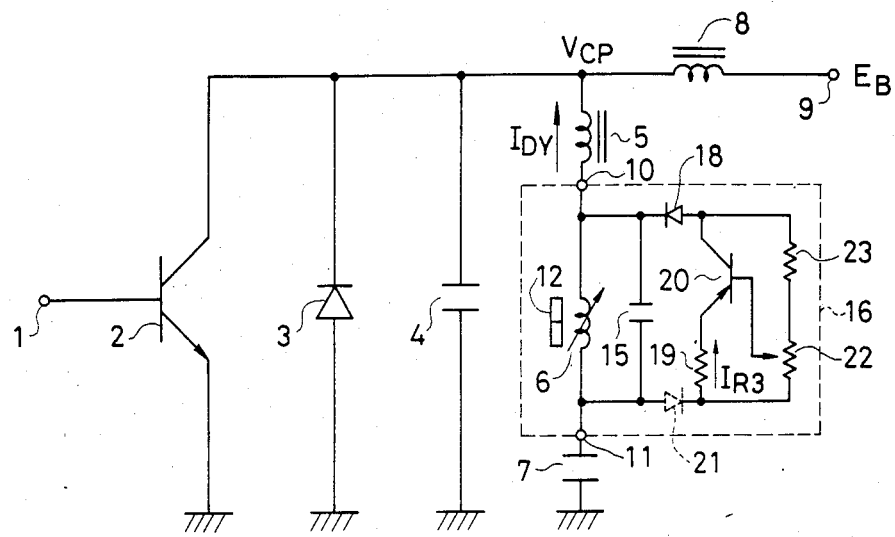
FIGS. 3, 4 and 5 are circuit diagrams showing other embodiments of the horizontal deflection output circuit according to the present invention.

FIG. 3 shows another embodiment of the present invention. In this embodiment, a linearity correcting circuit 16 is composed of the linearity correcting coil 6, the permanent magnet 12 for applying a magnetic field to the linearity correcting coil 6, the capacitor 15, a diode 18, a transistor 20, resistors 19 and 23, and a variable resistor 22.

The diode 18 may be replaced by a diode 21. The diode 18 has the same action of the diode 13 in the linearity correcting circuit 16 of FIG. 2A.

The resistor 19 has the same action as the resistor 14 of FIG. 2A to prevent the ringing due to the resonant circuit which is composed of the linearity correcting coil 6 and the stray capacity.

The transistor 20, the resistor 23 and the variable resistor 22 for adjusting the base voltage to be applied to the transistor 20, constitute together a current adjusting circuit for determining both the value of a current $I_{R3}$ to flow through the resistor 19 and the flow period of the current $I_{R3}$.

The voltage $(V_L - V_S)$ between the two terminals of the linearity correcting coil 6 is reduced gradually from the former to the latter half of the horizontal scanning period by the magnetic saturation. The period for which the transistor 20 has its conductivity from the ON to OFF state is determined by the resistance of the variable resistor 22.

As a result, by adjusting the variable resistor 22, the period for which the current is caused to flow through the resistor 19 can be limited to the period for which the ringing is occurring, to prevent the power loss by the resistor 19 for the remaining periods.

FIG. 6(g) shows the waveform of the current $I_{R3}$ which flows through the resistor 19 when the present circuit is operated under the conditions of the horizontal deflection frequency of 130 KHz and the horizontal deflection current 22 $[A_{p-p}]$. The loss at the resistor 19 of the present circuit is determined at 0.2 Watts by the aforementioned waveform analysis. This value is determined to be about one fortieth as high as that of the circuit of the prior art shown in FIG. 1B. The total value of the losses at the diode 18 (or the diode 21), the transistor 20, the resistors 19 and 23 and the variable resistor 22 is 1.0 Watt, which is about one eighth that of the circuit of the prior art shown in FIG. 1B.

According to the present circuit, moreover, since the transistor 20 acts not as a switch but as an amplifier, the current $I_{R3}$ to flow through the resistor 19 is varied if the bias voltage is varied by adjusting the variable resistor 22. This means that the transistor 20 has equivalently the same action as a variable resistor so that the present circuit provides the same effect as that obtained in case it is composed of the resistor 19 and the variable resistor.

Still moreover, the range of the adjustment of the current $I_{R3}$ is wider than that obtainable in case the transistor 20 is a variable resistor.

Figure 4:
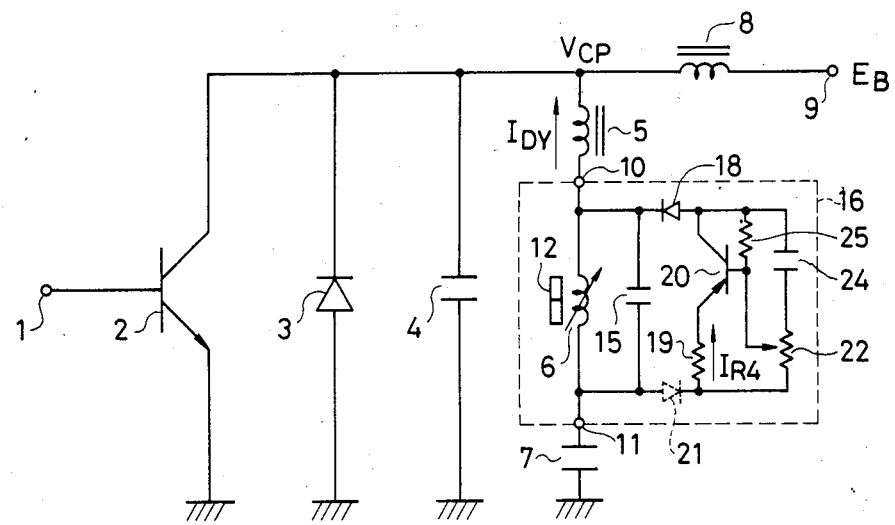

FIG. 4 shows still another embodiment of the present invention. The horizontal deflection output circuit according to this embodiment is equipped with a time constant circuit, which is composed of the variable resistor 22, a capacitor 24 and a resistor 25, as the circuit for feeding the bias voltage to the transistor 20 of the linearity correcting circuit 16. In this circuit, the transistor 20 has its base potential determined on the basis of the time constant, which is determined by the variable resistor 22 and the capacitor 24, so that its conductivity period is limited to the initial time of the scanning period for which the ringing occurs. As a result, it is only for a short period (i.e., $t_0$ to $t_1$ of FIG. 6) of the ringing occurrence that the current flows through the resistor 19, so that the loss at the resistor 19 is remarkably reduced. The charge stored in the capacitor 24 is discharged through the resistor 25 for the OFF period of the transistor 20. That resistor 25 may be replaced in dependence upon the characteristics of the transistor 20 by the resistance of the diode which is established between the base and collector of the transistor 20. FIG. 6(h) shows a current $I_{R4}$ which will flow through the resistor 19 in case the present circuit is operated under the conditions of the horizontal deflection frequency of 130 KHz and the horizontal deflection current of 22 $[A_{p-p}]$. The loss at the resistor 19 determined by the aforementioned waveform analysis is 0.04 Watts in the present circuit when the capacitor 24 has a value of 15,000 pF, the variable resistor 22 has a value of 500 ohms, and the time constant determined by the former two is 7.5 μs. The loss of 0.04 Watts is about one two hundredth of that of the circuit of the prior art shown in FIG. 1B. Moreover, the total value of the losses at the diode 18 (or the diode 21), the transistor 20, the resistor 19, the capacitor 24 and the variable resistor 22 is 0.16 Watts, which value is about one fiftieth as high as that of the circuit of the prior art shown in FIG. 1B.

Figure 5:
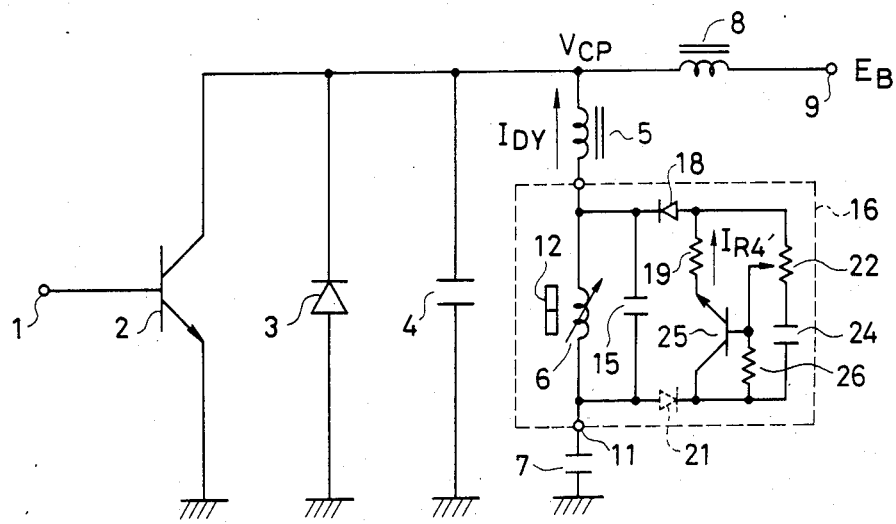

FIG. 5 is a circuit diagram showing a modification of the horizontal deflection output circuit of FIG. 4. In the present modification, an NPN type transistor 25 is used although the transistor 20 used in the horizontal deflection output circuit of FIG. 4 is of the PNP type. The current $I_{R4}'$ to flow through the resistor 19 in case the circuit shown in FIG. 5 is operated under the conditions of the horizontal deflection current 22 $[A_{p-p}]$ is similar to the value $I_{R4}$ of the circuit of FIG. 4. As a result, the present modification can enjoy an effect similar to that of the horizontal deflection output circuit of FIG. 4.

What is claimed is:

1. A horizontal deflection output circuit comprising: a switching element; a resonant capacitor connected in parallel with said switching element; and a first series circuit connected in parallel with said switching element and including a horizontal deflection coil and a linearity correcting coil, wherein the improvement comprises: a second series circuit connected in parallel with said linearity correcting coil, said second series circuit comprising load means for damping resonance energy in said first series circuit and current control means for limiting the current flow through said load means to the first half of a horizontal scanning period and including a one-way switching element which turns on for a first half of said horizontal scanning period and turns off for the last half of the horizontal scanning period and for a fly-back pulse period, thereby limiting current flow through said load means to the first half of said horizontal scanning period.

2. A horizontal deflection output circuit according to claim 1, wherein said load means includes a resistor.

3. A horizontal deflection output circuit according to claim 2, wherein a capacitor is connected in parallel with said linearity correcting coil.

4. A horizontal deflection output circuit according to claim 2, wherein said one-way switching element is a diode.

5. A horizontal deflection output circuit according to claim 1, wherein said load means includes: a resistor; and current adjusting means for adjusting the current to flow through said resistor.

6. A horizontal deflection output circuit comprising: a switching element; a resonant capacitor connected in parallel with said switching element; a series circuit connected in parallel with said switching element and including a horizontal deflection coil and a linearity correcting coil; and a series circuit connected in parallel with said linearity correcting coil and including load means and a one-way switching element adapted to be turned on for the front half of a horizontal scanning period, said load means including a resistor and current adjusting means for adjusting the current flow through said resistor, said current adjusting means including a transistor connected in series with said resistor and bias voltage feeding means for feeding a bias voltage to the base of said transistor.

7. A horizontal deflection output circuit according to claim 6, wherein a capacitor is connected in parallel with said linearity correcting coil.

8. A horizontal deflection output circuit according to claim 6, wherein said one-way switching element is turned off at least for a fly-back pulse period.

9. A horizontal deflection output circuit according to claim 6, wherein said one-way switching element is a diode.

10. A horizontal deflection output circuit according to claim 6, wherein said bias voltage feeding means includes resistance voltage-dividing means for dividing the voltage between the two terminals of said linearity correcting coil.

11. A horizontal deflection output circuit according to claim 10, wherein a capacitor is connected in parallel with said linearity correcting coil.

12. A horizontal deflection output circuit according to claim 10, wherein said one-way switching element is turned off at least for a fly-back pulse period.

13. A horizontal deflection output circuit according to claim 10, wherein said one-way switching element is a diode.

14. A horizontal deflection output circuit according to claim 10, wherein said bias voltage feeding means includes a time constant circuit composed of a resistor and a capacitor.

15. A horizontal deflection output circuit according to claim 14, wherein a capacitor is connected in parallel with said linearity correcting coil.

16. A horizontal deflection output circuit according to claim 14, wherein said one-way switching element is a diode.

17. A horizontal deflection output circuit according to claim 14, wherein said one-way switching element is turned off at least for a fly-back pulse period.

18. A horizontal deflection output circuit comprising: a switching element; a damper diode connected in parallel with said switching element; a resonant capacitor connected in parallel with said switching element; a first series circuit connected in parallel with said switching element and including a horizontal deflection coil and a linearity correcting coil; a second series circuit connected in parallel with said linearity correcting coil, said second series circuit comprising load means for damping resonance energy in said first series circuit and current control means for limiting the current flow through said load means to the first half of a horizontal scanning period and including a one-way switching element which turns on for the first half of said horizontal scanning period and turns off for the last half of said horizontal scanning period and a fly-back pulse period, thereby limiting current flow through said load means to said first half of said horizontal scanning period;

a choke coil connected with the cathode terminal of said damper diode; and a d.c. current blocking capacitor connected in series with said horizontal deflection coil.

19. A horizontal deflection output circuit according to claim 18, wherein said choke coil is a fly-back transformer.

20. A horizontal deflection output circuit according to claim 19, wherein said load means includes a resistor.

21. A horizontal deflection output circuit according to claim 20, wherein a capacitor is connected in parallel with said linearity correcting coil.

22. A horizontal deflection output circuit according to claim 20, wherein said one-way switching element is a diode.

23. A horizontal deflection output circuit according to claim 19, wherein said load means includes: a resistor; and current adjusting means for adjusting the current to flow through said resistor.

24. A horizontal deflection output circuit comprising:
a switching element;
a damper diode connected in parallel with said switching element;
a resonant capacitor connected in parallel with said switching element;
a series circuit connected in parallel with said switching element and including a horizontal deflection coil and a linearity correcting coil;
a series circuit connected in parallel with said linearity correcting coil and including load means and a one-way switching element adapted to be turned on for the front half of a horizontal scanning period, said load means including a resistor and current adjusting means for adjusting the current flow through said resistor, said current adjusting means including a transistor connected in series with said resistor and bias voltage feeding means for feeding a bias voltage to the base of said transistor;

a choke coil in the form of a fly-back transformer connected with the cathode terminal of said damper diode; and a d.c. current blocking capacitor connected in series with said horizontal deflection coil.

25. A horizontal deflection output circuit according to claim 24, wherein said one-way switching element is turned off at least for a fly-back pulse period.

26. A horizontal deflection output circuit according to claim 24, wherein a capacitor is connected in parallel with said linearity correcting coil.

27. A horizontal deflection output circuit according to claim 24, wherein said one-way switching element is a diode.

28. A horizontal deflection output circuit according to claim 24, wherein said bias voltage feeding means includes resistance voltage-dividing means for dividing the voltage between the two terminals of said linearity correcting coil.

29. A horizontal deflection output circuit according to claim 28, wherein said bias voltage feeding means includes a time constant circuit composed of a resistor and a capacitor.

30. A horizontal deflection output circuit according to claim 28, wherein said one-way switching element is turned off at least for a fly-back pulse period.

31. A horizontal deflection output circuit according to claim 28, wherein a capacitor is connected in parallel with said linearity correcting coil.

32. A horizontal deflection output circuit according to claim 28, wherein said one-way switching element is a diode.

* * * * *